United States Patent [19]

Rhoades

[11] Patent Number: 4,563,238

[45] Date of Patent: Jan. 7, 1986

[54] CHEMICAL DEBURRING SYSTEM WITH A SOLUBLE MASK

[75] Inventor: Lawrence J. Rhoades, Pittsburgh, Pa.

[73] Assignee: Extrude Hone Corporation, Irwin, Pa.

[21] Appl. No.: 647,533

[22] Filed: Sep. 5, 1984

[51] Int. Cl.$^4$ ............................ C23F 1/02; B44C 1/22; C03C 15/00; C03C 25/06

[52] U.S. Cl. .................................... 156/637; 156/645; 156/654; 156/659.1; 156/664; 156/904; 252/79.2; 252/79.3; 252/79.5

[58] Field of Search ............... 156/635, 637, 645, 654, 156/656, 659.1, 664, 904; 252/79.1–79.5

[56] References Cited

U.S. PATENT DOCUMENTS

| | | | |
|---|---|---|---|
| 3,247,572 | 4/1966 | Munk | 29/155.5 |
| 3,383,508 | 5/1968 | Russell | 156/656 X |
| 3,653,997 | 4/1972 | Rothschild et al. | 156/645 X |
| 3,719,536 | 3/1973 | Rheingold et al. | 156/645 X |
| 4,311,546 | 1/1982 | Abe et al. | 156/645 X |

*Primary Examiner*—William A. Powell
*Attorney, Agent, or Firm*—Fidelman, Wolffe & Waldron

[57] ABSTRACT

A process for chemically deburring a workpiece, comprising the steps of: coating the workpiece with a soluble masking material, allowing the masking material to pull away from sharp projections on the workpiece, such as burrs or edges, so that the sharp projections are thinly coated or not coated, exposing the coated workpiece to a corrosive solution so that the thinly or not coated sharp projections are chemically attacked by the corrosive solution, and stopping the chemical attack of the corrosive solution. These steps may be repeated, as necessary, until the sharp projections or burrs are removed or edges are sufficiently milled.

27 Claims, No Drawings

CHEMICAL DEBURRING SYSTEM WITH A SOLUBLE MASK

BACKGROUND OF THE INVENTION

The technology available today in edge and surface finishing and conditioning goes far beyond simply removing unwanted bits of metal for cosmetic purposes (although this is still important). Today it is known that controlled, consistent edge/surface finishing can dramatically improve product performance and life. Removing stress risers at sharp corners by producing controlled radii on edges can substantially improve thermal and mechanical fatigue strength of highly stressed components. Improved surface integrity produced by processes that either remove tensionally stressed surfaces, such as those remaining after thermal machining methods, or impart compressive stresses in their own right, can again improve fatigue strength of components.

Improved surface finishes (and radii) in passages through which gas or fluids will flow reduce boundary layer turbulence and improve flow rates. Improved surfaces and edges on gears improve service life and power transmission efficiency. The seemingly minute work that is being done on surfaces and edges—if done consistently by an automatic process—can improve the strength, reliability, service life or performance of the product being manufactured.

There are several major automatic finishing processes, some of these include abrasive flow finishing, thermal deburring blast finishing, vibratory finishing, centrifugal burrel finishing, electrochemical deburring radiusing, and chemical deburring. Some processes are selective, some are not; some are good at finishing internal areas, some are not; some require special tooling, others none; some involve measurable consumables costs, others practically none; most polish and radius while removing burrs, some don't; some involve a substantial investment in equipment; others are fairly inexpensive.

In the process of chemical deburring, a burr-containing workpiece is immersed in a corrosive medium which attacks the burrs and consumes them. For purposes of this discussion and the claims of this application, the term "burr" is intended to mean an undesirable projection of material that results from a cutting, forming, blanking or shearing process.

In most instances, chemical attack of the entire surface of the workpiece occurs and is frequently undesirable. To provide protection for these surfaces it is possible to mask-off those portions of the workpiece which are to be protected from the corrosive solution leaving only the unmasked portions, i.e., burrs, exposed to corrosive attack. However, the masking and unmasking of selected portions of a workpiece is a time consuming and expensive operation which rules out the use of chemical deburring especially in the case of workpieces with close tolerances or dimensions or workpieces in which internal surfaces are to be deburred. The process of the present invention is adaptable to all types of workpieces and is especially useful in situations with close tolerances or dimensions or for internal surfaces.

Many of the maskants which are known to the art are not soluble in the corrosive medium which attacks the burrs. Such a maskant is disclosed in U.S. Pat. No. 4,023,998 which describes the use of a protective foil or layer, which can consist of metal or plastic, to protect a thin metal layer in a laminate through which holes have been drilled. When the laminate is chemically treated to remove the burrs which form due to drilling, the metal foil which is not attacked, prevents the thin metal layer from dissolving as well.

U.S Pat. No. 4,023,998 also discloses, as an alternative, the use of a chemical agent which attacks the burr material more rapidly than it attacks the material in the protective foil or layer, indicating the protective layer may be soluble in the corrosive medium.

U.S. Pat. No. 3,741,804 discloses the formation of a protective layer of ice on a workpiece which is then chemically deburred. The low mass burrs are warmed by an aqueous metal-corroding medium which then melts the protective ice layer, exposing the burrs to selective attack by the corroding medium.

The present invention differs from that dislcosed in U.S. Pat. No. 4,023,998 in that the maskant is soluble in the corrosive medium, the maskant is not a protective foil, and the process is not limited to use on laminates used for printed wiring. The process of the present invention is adaptable to workpieces of all shapes and sizes and is especially useful for workpieces intricate detailing or close tolerances. The process of the present invention is also useful for deburring or milling internal surfaces or internal edges of workpieces. It would be difficult to apply a protective foil to most internal surfaces of any but the simplest workpieces.

The present invention is a marked improvement over that disclosed in U.S. Pat. No. 3,741,804 in that the maskant is more stable than ice and no refrigeration step is necessary. Using the process of the present invention, workpieces can be masked and then chemically deburred at some later time without loss of the maskant during the waiting period.

OBJECTS OF THE INVENTION

It is an object of the present invention to provide a process for chemically deburring or micromachining a workpiece without substantially corroding the workpiece surface and without resorting to expensive or complicated masking and unmasking techniques.

It is another object of the present invention to provide a process for chemically milling edges and other sharp projections without substantially corroding the remainder of the workpiece and without resorting to expensive or complicated masking and unmasking techniques.

It is a further object of this invention to provide a process for chemically deburring or micromachining the internal surfaces of a workpiece without resorting to expensive or complicated masking and unmasking techniques.

It is another object of this invention to provide a process for chemically deburring or micromachining a complexly shaped workpiece without resorting to expensive or complicated masking and unmasking techniques.

It is still another object of this invention to provide a process for chemically deburring or milling a workpiece using a soluble masking material which thins out or pulls away from sharper projections such as edges or burrs and concentrates on broad surfaces.

It is a further object of this invention to provide a process adaptable to controlled chemical deburring or milling of a workpiece wherein a workpiece is alternately masked with a soluble masking material and then subjected to a corroding media until the desired results are obtained.

It is a still further object of this invention to provide a process for chemically deburring or milling a workpiece using a cooled, soluble, thermosetting masking material which preferentially adheres to the warmest areas of a heated workpiece and becomes thinner on the burrs or edges of the workpiece.

It is another object of this invention to provide a process for chemically deburring or milling a workpiece using a heated, soluble, thermoplastic masking material which preferentially coats the coolest areas of a cooled workpiece and becomes thinner on the burrs or edges of the workpiece.

It is still another object of this invention to provide a process for chemically deburring or milling a workpiece using a soluble masking material and resonating the workpiece so that the masking material pulls away from the burrs and edges of the workpiece.

It is a further object of this invention to provide a process for chemically deburring or milling a workpiece using a masking material which can be heat set, cured, or dried thereby shrinking away from the burrs and edges of the workpiece.

DESCRIPTION OF THE INVENTION

The present invention comprehends the in situ formation of a masking layer on the surfaces of workpieces to be chemically deburred or milled. The workpiece is coated with the masking material by dipping, spraying, or other means known to the art so that a film forms over the entire surface of the workpiece. The maskant is thinner or pulls away at edges or burrs and during the deburring or milling operation, the film is retained on the large mass portions of the workpiece, but is dispelled from the low mass portions, such as the burrs and edges. The protected workpiece is then immersed into a corroding medium. The burrs or edges which have a comparatively low mass quickly lose their film while the bulk of the workpiece which has a larger mass retains it. As a result, the burrs or edges are attacked by the corroding medium while the film protected surfaces remain substantially unaffected.

The process of this invention comprehends a wide variation in treatment times, temperatures, and corroding media, all of which will vary according to the specific deburring problem encountered. Thicker burrs will require either stronger corrosive media or longer immersion times for complete removal. Edges which require a great deal of milling will also require either stronger corrosive media or longer immersion times for complete milling. The precise combination of time, temperature and corroding medium for any given deburring situation will vary with the composition and size of the metal workpiece, as well as the precise nature of the burr requiring removal or the edge requiring milling. Likewise, the available in-plant processing time and equipment will to some extent dictate the selection of the most desirable combination of parameters for a given application. These parameters can readily be derived in short order by one having skill in this art.

This process is useful with any metal or alloy which can be chemically corroded. Among the possible metal and corroding media combinations are:

(1) sodium hydroxide (8%–20%) which is useful with the aluminums;

(2) ferric chloride (e.g., 36° Baume'), which is useful with aluminum, beryllium-CU, brass, chromium, Constantan, copper, Hastelloys, Havar, Invar, Ivar, Inconels, lead, moly Permalloy, Nichrome, nickel, nickel silver, Phosphor bronze, stainless 300 (LO), steels,, tin. Adding about 1% muriatic acid to the $FeCl_3$ will increase its etching speed;

(3) chromic-sulfuric acid, which is useful with beryllium CU, brass, copper and Kovar;

(4) hydrochlroic acid, which is useful with chromium and manganese;

(5) hydrofluoric acid, which is useful with germanium and titanium;

(6) hydrofluoric-nitric acid which is useful with silicon steel, germanium, tantalum and titanium;

(7) nitric acid, which is useful with cast iron, magnesium, molybdenum, silver, tellurium, zinc and steels;

(8) nitric-hydrochloric acid, including aqua regia, which is useful with molybdenum, gold, platinum, stainless steel 300 (hi), and titanium;

(9) U.S. Pat. Nos. 3,057,764 and 3,057,765 for stainless steel, nickel-base and cobalt-base alloys; and

(10) nitric acid-ammonium bifluoride, which is useful for 400 series stainless steels. Many other metal-corroding media combinations known to the art but not listed here are also useful for purposes of this invention.

In order to selectively remove burrs or mill edges using the preferred mode of the soluble mask/chemical deburring or milling process of this invention, the workpiece is first coated with a soluble masking material. It is preferred that the masking material be diluted to a consistency which ensures a surface tension of appropriate magnitude such that the resultant coating applied to the workpiece pulls away from or thins out at sharp projections, such as edges, burrs, and concentrates on the broad surfaces.

The other preferred characteristic of the masking material is that it should be slightly more soluble than the workpiece itself. This characteristic is important because it allows for a smooth transition between the milled and non-milled area. This is due to the fact that the maskant is thinnest at the edges or burrs of the workpieces. While the burrs or edges are attacked, these thinner areas of maskant are dissolved away, constantly exposing workpiece surface at the transition between coated and non-coated workpiece. This dissolution of maskant occurs at a faster rate than the dissolution of the main body of the workpiece which is gradually exposed during this process. If the proper amount of maskant is applied, the result of this process is that the burr is consumed leaving a smooth transition between the protected and non-protected portions of the workpiece. This smooth transition would not be as consistently attainable if a non-soluble maskant were used. Instead a step would form at the boundary of the protected and non-protected portions of the workpiece. The masking material of present inventions does not cause step formation.

Suitable masking material include polyethylene glycol, which is soluble in sulphuric and hydrochloric acid, polyacrylic acid which dissolves in alkaline solutions, polyvinyl chloride, copolymers of hydroxyethylmethacrylate with other acrylic comonsmers, of the like. The appropriate masking material and corroding media can be selected for a given workpiece.

The coated workpiece is then immersed in a corrosive solution in order to erode the protruding burrs or mill the edges. The gradual erosive action removes the masking material as well as the burrs, but the coating should be of adequate thickness to prevent any stock removal from the broad surfaces of the workpiece, as the burrs are being eroded.

The maskant is never fully dissolved during the preferred mode of this process, but should it become very thin before the burr has been completely removed, further coatings of maskant can be applied and the process repeated.

The preferred mode of this process is also adaptable to controlled milling or deburring in that the workpiece may be removed from the corroding media, the corrosion process stopped by some means known to the art and then the workpiece may be recoated with the masking material and redipped in the corroding media. Repeating this process allows one to carefully control the milling or deburring.

Variations of the preferred mode of this invention can increase the selectivity of burr removal by heating the workpiece before applying the maskant. The masking material, which has been cooled, is then applied to the workpiece where it will adhere more readily to the warmest parts. The main body of the workpiece will retain proportionately more heat than the burrs or edges. A layer of masking material will therefore adhere preferentially to the main body of the workpiece becoming thinner on said burrs or edges. The workpiece is then immersed in the acid or alkaline solution to remove the protruding burrs and, where desired, to produce an edge radius.

Alternatively, a maskant with significant viscosity temperature sensitivity will, if preheated, provide a significantly thicker coating when cooled by the broad surface of a cool part dipped into the heated maskant bath. Sharp edges and burrs will be quickly warmed by the hot bath due to their higher surface area to mass ratio, yielding a thinner maskant coating.

Another variation of this process involves coating the workpiece with the maskant and then resonating the workpiece. The resonance can be produced by either physical or ultrasonic means. The edges and burrs will resonate at higher frequencies than the broad surfaces of the workpieces, causing the maskant to become thinner in these areas. This method is particularly useful in situations involving rolled over burrs. Due to the nature of this type of burr maskant tends to buildup under the burr, preventing attack from the underside and slowing the burr removal process. By resonating the workpiece after coating it with maskant, the unwanted buildup of maskant underneath the burr can be removed.

The masking material may also be heat set, during which process the coating shrinks away from edges and burrs. It may also be cured or dried and depending on the material may also undergo cross-linkage. These also serve to yield a thinner maskant coating on the edges and burrs of the workpiece.

What is claimed is:

1. A process for chemically deburring, or micromachining, a workpiece, or chemically milling edges of a workpiece comprising the steps of:
   coating said workpiece with a soluble masking material;
   allowing said masking material to pull away from sharp projections on said workpiece, such as burrs or edges, so that said sharp projections are thinly coated or not coated;
   exposing said coated workpiece to a corrosive solution so that said thinly or not coated sharp projections are chemically attacked by said corrosive solution; and
   stopping said chemical attack of said corrosive solution.

2. The process of claim 1, wherein the steps of coating, pulling away, exposing and stopping are repeated, until said sharp projections are removed.

3. The process of claim 1, wherein said masking material is heat set before said workpiece is exposed to said corrosive solution.

4. The process of claim 3, wherein said heat set masking material shrinks and pulls away from said sharp projections.

5. The process of claim 1, wherein said masking material is cured before said workpiece is exposed to said corrosive solution.

6. The process of claim 5, wherein said cured masking material shrinks and pulls away from said sharp proejctions.

7. The process of claim 1, wherein said masking material is dried before said workpiece is exposed to said corrosive solution.

8. The process of claim 7, wherein said heat set masking material shrinks and pulls away from said sharp projects.

9. The process of claim 1, wherein said masking material undergoes cross-linking before said workpiece is exposed to said corrosive solution.

10. The process of claim 9, wherein said cross-linked masking material shrinks and pulls away from said sharp projections.

11. The process of claim 1, wherein said workpiece is heated and said soluble masking material is cooled before said coating step.

12. The process of claim 11, wherein said cooled masking material adheres preferentially to the warmest parts of said workpiece.

13. The process of claim 12, wherein said sharp projections of said workpiece are cooler than the main body of said workpiece.

14. The process of claim 1, wherein said soluble masking material is heated before said coating step.

15. The process of claim 14, wherein said heated masking material heats said sharp projections of said workpiece and is cooled by the main body of said workpiece.

16. The process of claim 15, wherein said heat masking material forms a thinner coating or no coating over said heated sharp projections and a thicker coating over said main body of said workpiece.

17. The process of claim 1, wherein after said coating step, said coated workpiece is resonated.

18. The process of claim 17, wherein said resonation is produced by physical means.

19. The process of claim 17, wherein said resonation is produced by ultrasonic means.

20. The process of claim 17, wherein said resonating step is performed before said exposing step.

21. The process of claim 17, wherein said resonating step is performed at the same time as said exposing step.

22. The process of 17, wherein said sharp projections of said workpiece resonate at higher frequencies than the main body of said workpiece.

23. The process of claim 22, wherein said coating on said sharp projections of said workpieces becomes thinner because of said higher resonating frequencies.

24. The process of claim 1, wherein said masking material comprises at leat one member selected from the group consisting of polyethylene glycol, polyacrylic acid, polyvinyl chloride and copolymers of hydroxyethylmetharylate with other acrylic comonomers and combinations thereof.

25. The process of claim 1, wherein the internal surfaces of said workpieces are chemically deburred or micromachined.

26. The process of claim 1, wherein the edges of the internal surfaces of said workpiece are chemically milled.

27. The process of claim 1, wherein said workpiece is a complex shaped.

* * * * *